(12) United States Patent
Kwon et al.

(10) Patent No.: US 7,327,038 B2
(45) Date of Patent: Feb. 5, 2008

(54) SEMICONDUCTOR DEVICE PACKAGE

(75) Inventors: Heung-Kyu Kwon, Gyeonggi-do (KR);
Tae-Je Cho, Gyeonggi-do (KR);
Kyung-Lae Jang, Gyeonggi-do (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 11/322,886

(22) Filed: Dec. 27, 2005

(65) Prior Publication Data

US 2006/0138624 A1    Jun. 29, 2006

Related U.S. Application Data

(60) Provisional application No. 60/639,662, filed on Dec. 27, 2004.

(30) Foreign Application Priority Data

Mar. 14, 2005    (KR) .................. 10-2005-0021180

(51) Int. Cl.
*H01L 23/48* (2006.01)
*H01L 23/52* (2006.01)
(52) U.S. Cl. .............. 257/777; 257/780; 257/781; 257/782; 257/784; 257/E27.137; 257/E27.144; 257/E27.161
(58) Field of Classification Search ............. 257/678, 257/723, 777, 779–785, E25.013, 625, 676, 257/E27.137, E27.144, E27.161, E23.023, 257/E23.077; 438/118, 406, 455–459, 615–617; 156/325–338
See application file for complete search history.

(56) References Cited

U.S. PATENT DOCUMENTS 5,422,435 A * 6/1995 Takiar et al. .............. 174/521

(Continued)

FOREIGN PATENT DOCUMENTS

JP    2001-257307    9/2001

(Continued)

OTHER PUBLICATIONS

English language abstract of Korean Publication No. 2003-0048250.

(Continued)

*Primary Examiner*—Jasmine Clark
(74) *Attorney, Agent, or Firm*—Marger Johnson & McCollom, P.C.

(57) ABSTRACT

Provided is a semiconductor device package in which instability of a bonding wire that may occur when a plurality of semiconductor chips are stacked is prevented and which obtains a light, thin and small structure. The semiconductor device package includes a substrate having a plurality of substrate pads on a top surface of the semiconductor device package and includes a plurality of semiconductor chips stacked on the substrate. Each of the semiconductor chips have a chip pad electrically connected to a common pin, e.g., to which a common signal may be concurrently applied to each of the semiconductor chips. An interposer chip, also stacked on the substrate, has a connecting wire electrically connected to the chip pad, the common pin of each of the semiconductor chips being thereby electrically coupled at the connecting wire via the chip pad, and the connecting wire being thereby electrically connected to the substrate pad.

24 Claims, 2 Drawing Sheets

U.S. PATENT DOCUMENTS

| | | | |
|---|---|---|---|
| 6,407,456 B1* | 6/2002 | Ball | 257/777 |
| 6,476,506 B1* | 11/2002 | O'Connor et al. | 257/786 |
| 6,621,169 B2* | 9/2003 | Kikuma et al. | 257/780 |
| 6,979,905 B2* | 12/2005 | Nishida et al. | 257/777 |
| 2002/0024146 A1* | 2/2002 | Furusawa | 257/777 |
| 2004/0099938 A1* | 5/2004 | Kang et al. | 257/686 |
| 2004/0108590 A1* | 6/2004 | Kledzik et al. | 257/707 |
| 2004/0150084 A1* | 8/2004 | Nishida et al. | 257/678 |
| 2004/0164385 A1* | 8/2004 | Kado et al. | 257/678 |
| 2006/0087013 A1* | 4/2006 | Hsieh | 257/678 |

FOREIGN PATENT DOCUMENTS

| | | |
|---|---|---|
| JP | 2004-235352 | 8/2004 |
| KR | 2003-0048250 | 6/2003 |

OTHER PUBLICATIONS

English language abstract of Japanese Publication No. 2001-257307.

English language abstract of Japanese Publication No. 2004-235352.

* cited by examiner

SEMICONDUCTOR DEVICE PACKAGE

This application claims priorities from Korean Patent Application No. 10-2005-0021180 filed on Mar. 14, 2005 in the Korean Intellectual Property Office, and U.S. Provisional Patent Application No. 60/639,662 filed on Dec. 27, 2004 in the United States Patent and Trademark Office, the disclosures of which are incorporated herein in their entireties by reference.

BACKGROUND

1. Field of the Invention

The present invention relates to a semiconductor device package, and more particularly, to a semiconductor device package in which a plurality of semiconductor chips are stacked.

2. Description of the Related Art

To realize high-density arrangement of semiconductor chips, a key technology for reducing electronic device dimensions and weight, a variety of semiconductor packaging techniques have developed.

Semiconductor packaging structures requiring reduced area for installation, e.g., onto a motherboard, include: a pin-insert package such as DIP (Dual Inline Package); a surface installation package, such as SOP (Small Outline Package), performed by leading a periphery; and a package such as BGA (Ball Grid Array) in which external output terminals are disposed on an under surface of the package in a lattice manner. Further, techniques for realizing high-density installation by reducing an area ratio of a package with respect to semiconductor chips include various efforts to narrow a pitch of the external output terminals and reduce a package size by making finer substrate wiring.

Further, a multi-chip package, e.g., a plurality of semiconductor chips installed as a single package, has been developed as a chip-stacked package, e.g., a plurality of semiconductor chips stacked, to realize a higher-density installation. The multi-chip package may include a system-in package in which a plurality of semiconductor chips having different functions are sealed and interconnected for operation as a coordinated multi-chip system within a single package.

Meanwhile, in the context of making an electronic device smaller, lighter, and thinner, another method is gaining attention. This method uses a "system-on chip" approach wherein circuits such as a memory circuit, a logic circuit, and an analog circuit conventionally provided separately are provided in combination and integrated in a single semiconductor chip operating as a single-chip system.

However, incorporating circuits such as the memory circuit and the logic circuit into a single chip raises several problems. It is difficult to reduce a voltage of the memory circuit and it is necessary to perform an additional process for reducing noises occurring in the logic circuit. Further, when an analog circuit, which has been conventionally constituted of a bipolar member, is provided in combination with other circuits it is difficult to manufacture the analog circuit by using the same CMOS as the memory circuit and the logic circuit.

Under such circumstances, the "system-in package" (SIP) approach has received more attention than the "system-on chip" approach, the SIP being better adapted for a shorter development period and at lower cost.

A conventional semiconductor chip design, however, usually determines the positions of, for example, a chip pad and the like without considering the semiconductor chip a component in a SIP. Thus, when forming the SIP each of the semiconductor chips is electrically connected to a printed circuit board (PCB) or substrate using bonding wires, but bonding wires tend to contact each other and can undesirably short. Further, a circuit for a PCB in a SIP can be very complicated, making trace routing difficult when all signals are taken from all semiconductor chip directly.

In addition, a SIP structure may include a plurality of semiconductor chips stacked with the larger chips at the bottom and smaller at the top, e.g., stacked with the chip progressively smaller from bottom to top. This arrangement prevents the one of the stacked semiconductor chips from covering the bonding pads of a lower semiconductor chip. The bonding terminals on the substrate are disposed outside the lowermost semiconductor chip. Thus, when the uppermost semiconductor chip and the lowermost semiconductor chip are different in size, a distance between the bonding pad of the uppermost semiconductor chip and the bonding terminal on the substrate is relatively long, and a corresponding relatively long length of bonding wire is required. Frequently, the logic/analog LSI is much smaller than the memory LSI, i.e., smaller in chip size. Thus, in a semiconductor device arranged with the relatively smaller logic/analog LSI stacked upon the relatively larger memory LSI and with each LSI wire bonded to the other, the wire is necessarily longer. The wire becomes brittle and tends to drop off when the semiconductor chips are sealed. Further, the relatively longer wire has a greater tendency to hang or sag downward due to its relatively greater weight.

In a typical SIP, a memory semiconductor chip and a logic/analog semiconductor chip are stacked on a substrate with the relatively larger memory chip in a lower stack position. However, the number of pins of the upper logic/analog semiconductor chip is large, more than that of the lower memory chip, bonding wires from the memory semiconductor chip and the logic/analog semiconductor chip may be entangled. In other words, the many bonding wires from the upper logic/analog chip must reach over those of the lower memory chip and thereby provide multiple opportunities for undesirable contact, e.g., shorting, therebetween.

Also, to attain a lighter, thinner, smaller SIP and to maintain a high-quality SIP, there exists a need for performing a direct access test on each semiconductor chip of the SIP after formation as a package.

SUMMARY

Placing an interposer element in a stack of semiconductor chips allows electrical connection or concentration of multiple common signals, e.g., as applicable to address and data pins, at the interposer element. A lesser number of electrical connections are then routed from the stack at the interposer element to the substrate. Leaving isolated certain independent signals, e.g., as applied to chip select, power and ground pins, allows selected and separate semiconductor chip testing including application of common signals, e.g., address and data signals to the formed semiconductor package.

DETAILED DESCRIPTION

Advantages and features of embodiments of the present invention and methods of accomplishing the same may be understood more readily by reference to the following detailed description and the accompanying drawings wherein like reference numerals refer to like elements. The present invention, however, may be embodied in many different forms and should not be construed as limited to those particular embodiments set forth herein. Rather, these embodiments are provided as thorough and complete disclosure conveying aspects of the invention to those skilled in the art; the invention being defined by the appended claims.

Embodiments of the present invention will now be described more fully with reference to the accompanying drawings.

Figure 1:
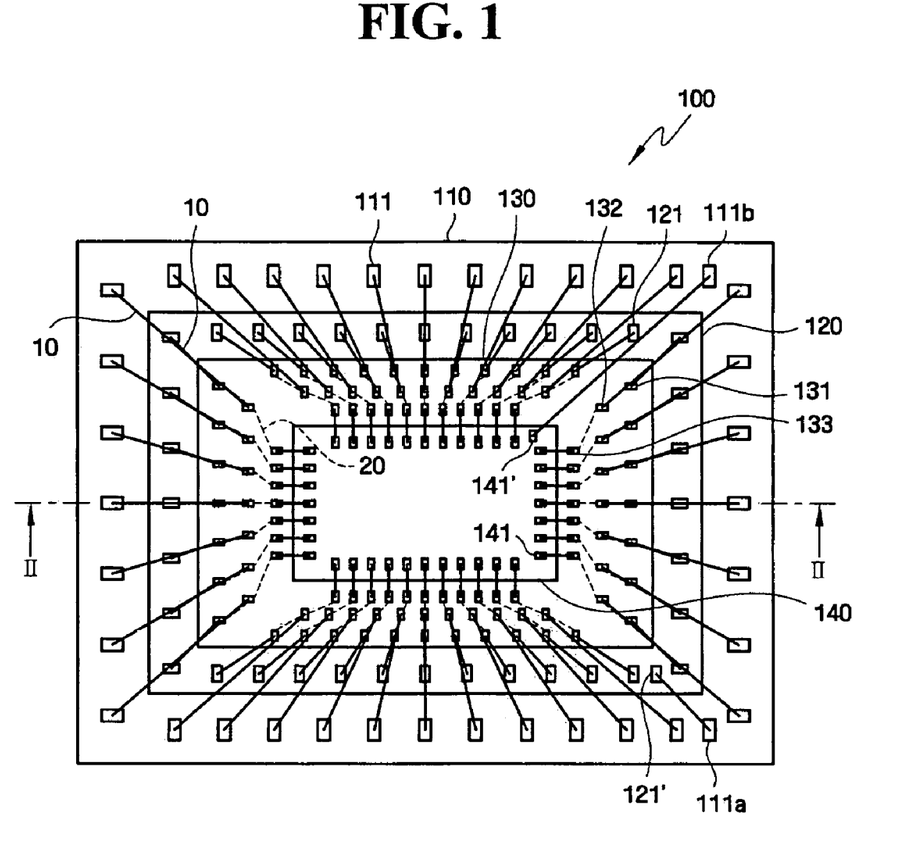
FIG. 1 is a plan view of a semiconductor device package according to an embodiment of the present invention.
Figure 2:
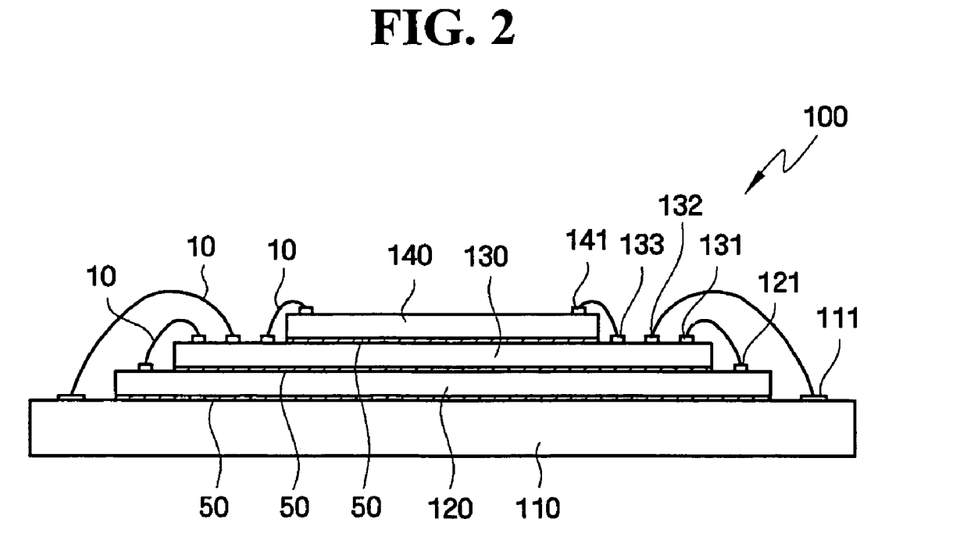
FIG. 2 is a cross-sectional view of the semiconductor device package illustrated in FIG. 1 as taken along line II-II' of FIG. 1.

FIG. 1 is a plan view of a semiconductor device package according to an embodiment of the present invention. As shown in FIGS. 1 and 2, a semiconductor device package 100 is formed by sequentially stacking a semiconductor chip 120, an interposer chip 130, and a semiconductor chip 140 on a substrate 110. Adhesive layers 50 between the substrate 110 and the semiconductor chip 120, between the semiconductor chip 120 and the interposer chip 130, and between the interposer chip 130 and the semiconductor chip 140 mechanically join the stack of elements.

The substrate 110 and its substrate pads 111 may be established by forming a wire layer on an insulating layer, such as a thin plate formed of inorganic matter. Substrate pads 111 may be formed as the wire layer on the substrate 110. A substrate pad 111 may be used as an electrode pad of an I/O electrode for external connection and as a bonding pad for performing wire bonding. A substrate pad 111 may be electrically connected to a common pin of the semiconductor chip 120 and the semiconductor chip 140. In addition, substrate pads 111a and 111b, e.g., for electrically connecting the semiconductor chip 120 and the semiconductor chip 140, may be used as a wire layer formed on the substrate 110. For example, the substrate pad 111a may be electrically connected to a chip select pin of the semiconductor chip 120, and the substrate pad 111b may be electrically connected to a chip select pin of the semiconductor chip 140 as described more fully hereafter.

A resin film, glass fiber material for impregnating resin, ceramics, and the like may be used as an inorganic material in thin plate form as the substrate 110. In addition, a lead frame, a ball grid array, and the like may be used as the substrate 110.

The semiconductor chip 120 includes wires (not shown) formed on a top surface of the semiconductor chip 120, common pins (not shown) connected to the wires, independent pins (not shown) connected to the wires, and chip pads 121 and 121' formed along an edge of the top surface of the semiconductor chip 120.

The semiconductor chip 120 may have functional devices, e.g., circuit devices such as transistors and the like, formed on a silicon substrate. The semiconductor chip 120 may be a memory chip or a logic/analog semiconductor chip. The common pins may be data pins and/or address pins operative relative to the functional devices, and the independent pins may be a power pin, a ground pin or a chip select pin operative relative to the functional devices.

The chip pads 121 and 121' may be used as electrode pads of an I/O electrode for externally connecting the semiconductor chip 120 and as a bonding pad for performing wire bonding. The chip pad 121 is electrically connected to the common pin of the semiconductor chip 120 and is electrically connected to a first bonding pad 131 of the interposer chip 130. In addition, the chip pad 121' is electrically connected to a chip select pin of the semiconductor chip 120 and is electrically connected to the substrate pad 111a of the substrate 110. In the embodiment shown in FIGS. 1 and 2, the chip pad 121' is electrically connected to the substrate pad 111a using a direct bonding wire 10. However, the present invention is not limited to this and the chip pad 121' may be electrically connected to the substrate pad 111a via a connecting wire of the interposer chip 130. Although the independent pin as a chip select pin has been illustrated, like the chip select pin, the independent pin as a power pin or a ground pin may be electrically connected to the substrate pad 111a from the chip pad of the semiconductor chip 120 using the direct bonding wire 10 or may be electrically connected to the substrate pad 111a via the connecting wire of the interposer chip 130.

An insulating layer formed of SiN or polyimide etc., but excluding the chip pads 121 and 121', may protect the wire layer of the semiconductor chip 120.

Like the semiconductor chip 120, the semiconductor chip 140 includes wires (not shown) formed on a top surface of the semiconductor chip 140, common pins (not shown) connected to the wires, independent pins (not shown) connected to the wires, and chip pads 141 and 141' formed along an edge of the top surface of the semiconductor chip 140.

The semiconductor chip 140 may have functional devices, e.g., circuit devices such as transistors and the like, formed on a silicon substrate. The semiconductor chip 140 may be a memory chip or a logic/analog semiconductor chip. The common pins correspond to data pins and/or address pins operative relative to the functional devices of the chip l4O, and the independent pins correspond to a power pin, a ground pin or a chip select pin operative relative to the functional devices of the chip 140.

The chip pads 141 and 141' may be used as electrode pads of an I/O electrode for externally connecting the semiconductor chip 120 and as a bonding pad for performing wire bonding. The chip pad 141 is electrically connected to the common pin of the semiconductor chip 140 and is electrically connected to a third bonding pad 133 of the interposer chip 130. In addition, the chip pad 141' is electrically connected to a chip select pin of the semiconductor chip 140 and is electrically connected to the substrate pad 111b of the substrate 110. In the embodiment shown in FIGS. 1 and 2, the chip pad 141' is electrically connected to the substrate pad 111b using a direct bonding wire 10. However, the present invention is not limited to this and the chip pad 141' may be electrically connected to the substrate pad 111b via a connecting wire of the interposer chip 130. Although the independent pin as a chip select pin has been illustrated, like the chip select pin, the independent pin as a power of ground pin may be electrically connected to the substrate pad 111b from the chip pad of the semiconductor chip 140 using the direct bonding wire 10 or may be electrically connected to the substrate pad 111b via the connecting wire of the interposer chip 130.

An insulating layer formed of SiN or polyimide etc., but excluding the chip pads 141 and 141', may protect the wire layer of the semiconductor chip 140.

The interposer chip 130 may be a dummy semiconductor chip formed from a wafer. In this particular embodiment, the dummy semiconductor chip is a semiconductor chip having no functional devices. In addition, the interposer chip 130 may be formed of a flexible printed circuit board (FPC) or a printed circuit board (PCB). Generally, the interposer chip 130 serves as a platform for concentrating signals from the surrounding, e.g., above and below, semiconductor chips 120 and 140 and then relaying the signals collectively to the substrate 110.

A connecting wire is formed in a single layer or multiple layers at one side of the interposer chip 130. The connecting wire includes a first bonding pad 131, a second bonding pad 132, a third bonding pad 133, and a wire 20. Thus, the pads 131, 132, and 133 are electrically coupled by way of wire 20 and collectively provide a connecting or coupling region for concentrating a common signal thereat. The first bonding pad 131 is electrically connected to the chip pad 121 of the semiconductor chip 120. The first bonding pad 131 and the chip pad 121 may be electrically connected using the bonding wire 10. The third bonding pad 133 is electrically connected to the chip pad 141 of the semiconductor chip 140. The third bonding pad 133 and the chip pad 141 may be electrically connected using the bonding wire 10. The second bonding pad 132 is electrically connected to the substrate pad 111 of the substrate 110. The second bonding pad 132 and the substrate pad 111 may be electrically connected using the bonding wire 10.

In a particular embodiment of the present invention, e.g., where the semiconductor chip 120, the interposer chip 130, and the semiconductor chip 140 are sequentially stacked, the first bonding pad 131 may be disposed near the semiconductor chip 120, and the third bonding pad 133 may be disposed closer to the semiconductor chip 140 than the first bonding pad 131.

The wire 20 electrically connects the first bonding pad 131, the second bonding pad 132, and the third bonding pad 133. In other words, the wire 20 and the pads 131, 132, and 133 collectively establish a coupling or connecting region on the interposer chip 130 allowing opportunity to concentrate common signals thereat. Thus, the common pin of the semiconductor chip 120 is electrically connected to the second bonding pad 132 via the chip pad 121 and the first bonding pad 131. The common pin of the semiconductor chip 140 is electrically connected to the second bonding pad 132 via the chip pad 141 and the third bonding pad 133.

In this way, the bonding wire with the common pin for each of the semiconductor chips 120 and 140 is concentrated on the connecting wire of the interposer chip 130, and the connecting wire of the interposer chip 130 and the substrate pad 111 of the substrate 110 are electrically connected. Thus, in a conventional semiconductor device package stacked in multiple layers, when a data pin or an address pin for each semiconductor chip is separately wire bonded with the substrate, wires and substrate pads corresponding to the wires having the number of data pins or address pins for each semiconductor chip are needed. Because the length of the wires becomes large, the wires may sag, or due to a number of wires, the wires may contact and be shorted, or since a wide space for the substrate pad is needed, a package cannot be easily made lighter, thinner and smaller.

In the semiconductor device package 100, however, a common pin to which a signal is commonly applied to multiple semiconductor chips is electrically connected to the interposer chip 130, and then, the interposer chip 130 and the substrate 110 are electrically connected such that the number of the wires can be reduced, and since each semiconductor chip is electrically connected to the substrate via the interposer chip 130, the length of the individual wires need not be large. In addition, since the common pins are connected to the substrate by binding each other such that the number of the substrate pads can be remarkably reduced and the package can be made lighter, thinner and smaller.

While the present discussion has focused on concentrating a single common pin signal from the semiconductor chips 120 and 140, it will be understood that in a given implementation a plurality of common pins for one semiconductor chip, e.g., the semiconductor chip 120, are coupled one-to-one with a corresponding plurality of common pins for another semiconductor chip, e.g., the semiconductor chip 140. In this manner, for example, a first set of address and data signal paths is concentrated or electrically coupled with a second set of address and data signal paths at the interposer chip 130 and then taken along a single set of address and data paths to the substrate 110. Independent signals, e.g., chip select, power, and ground are maintained separate, even if routed by way of the interposer chip 130, at the substrate 110 for separate use, e.g., as in a direct access test applied to individual ones of the semiconductor chips.

The configuration of the connecting wire of the interposer chip 130 is not limited to this arrangement. For example, when direct wire bonding can provide the wire 20, the bonding pad need not be formed on a connecting wire. In addition, the connecting wire can be formed as the bonding pad such that a plurality of bonding wires can be bonded to one another at one bonding pad.

In an embodiment of the present invention, the first bonding pad 131 is disposed along a circumferential side of the interposer chip 130. In addition, the third bonding pad 133 is disposed along a circumferential side of the semiconductor chip 140 at an inside of the first bonding pad 131. In addition, the wires 20 are disposed in a radial shape toward the first bonding pad 131 from the third bonding pad 133 and need not to cross one another. The second bonding pad 132 may be formed on the wire 20. In addition, the first bonding pad 131, the second bonding pad 132, and the third bonding pad 133 may remain on the surface of the connecting wire and the surface of the connecting wire may be sealed by an insulating layer.

As described above, the interposer chip 130 may be formed using a wafer, an FPC or a PCB. In particular, the interposer chip 130 may be formed of the same material and structure as the wafer used in forming the semiconductor chip 120 or the semiconductor chip 140. In addition, the first bonding pad 131, the second boding pad 132, the third bonding pad 133, and the wire 20 can be formed on the interposer chip 130 using the same process and device as those used in forming a wire layer on the semiconductor chip 120 or the semiconductor chip 140. Thus, since the same material or manufacturing device as that used in forming the semiconductor chip 120 or the semiconductor chip 140 is used in forming the interposer chip 130, costs required for forming the interposer chip 130 and manufacturing time can be reduced. In addition, since, when forming the connecting wire on the wafer, the minimum wire pitch can be equal to or smaller than 1 μm, a wire pitch of the connecting wire of the interposer chip 130 may also be finely formed to be equal to or smaller than 1 μm.

Gold, gold alloy, aluminum or aluminum alloy can be used for a bonding wire used in an embodiment of the present invention and can be bonded using a tool such as capillary bonding or ball bonding or wedge bonding.

Thus, according to embodiments of the present invention, a logic/analog semiconductor chip may be disposed on the lowermost or uppermost layer of the substrate 110. In general, the number of pins of the logic/analog semiconductor chip is larger than that of a memory semiconductor chip. A common pin among pins of the semiconductor chip is wire bonded with the substrate 110 via the interposer chip 130, and the other independent pins are separately wire bonded with the substrate 110. Since the number of the independent pins of the logic/analog semiconductor chip is larger than the independent pins of the memory semiconductor chip, the logic/analog semiconductor chip may be disposed on the lowermost or uppermost layer of the substrate 110 such that contact and shorting between the wires is prevented.

A testing operation of a semiconductor device package illustrated in FIGS. 1 and 2 will now be described.

To test the semiconductor chips 120 and 140, even after being formed into the semiconductor device package 100 of FIGS. 1 and 2, a direct access test can be used. As described previously, a common pin of each semiconductor chip 120 or 140 is connected to each chip pad 121 or 141, each chip pad 121 or 141 is concentrated on the connecting wire of the interposer chip 130 using the bonding wire 10, and the connecting wire is electrically connected to the substrate pad 111 using the bonding wire 10. The chip select pin of each semiconductor chip 120 or 140 is connected to each chip pad 121' or 141', and each chip pad 121' or 141' is electrically connected to each substrate pad 111a and 111b using the bonding wire 10.

Thus, when the direct access test is performed on the semiconductor chip 120, for example, high impedance is applied to the chip select pin connected to the chip pad 141'. This floats or deactivates the semiconductor chip 140 during testing of the semiconductor chip 120. Accordingly, when a test signal is applied to the second bonding pad 132 of the interposer chip 130, the direct access test operates only relative to the semiconductor chip 120.

Similarly, when the direct access test is performed on the semiconductor chip 140, high impedance is applied to the chip select pin connected to the chip pad 121' to float or deactivate the semiconductor chip 120. When the test signal is applied to the second bonding pad 132 of the interposer chip 130, the direct access test operates only relative to the semiconductor chip 140.

In this way, in the semiconductor device package 100, the bonding wire 10 with the common pin for each of the semiconductor chips 120 and 140 is concentrated on the connecting wire of the interposer chip 130, and the connecting wire of the interposer chip 130 and the substrate pad 111 are electrically connected using the bonding wire 10 such that the package can be made light, thin and small.

In addition, according to the structure of the semiconductor device package 100, the range of the direct access test for securing high-quality of the semiconductor chips 120 and 140 can be widened, and since each semiconductor chip can be separately tested using a direct access test program on a conventional semiconductor device package formed of one semiconductor chip, additional equipment need not to be provided and manufacturing costs can be reduced.

The chip select pins remain independently operable to separately test each semiconductor chip; accordingly a logic circuit for bypass of a test signal need not be additionally formed on each semiconductor chip.

In addition, in the structure of the semiconductor device package 100, when a semiconductor chip is a logic/analog semiconductor chip, a tolerant withdrawal electrode can be used in a burn-in test so that the semiconductor chip can withstand a high voltage.

Figure 3:
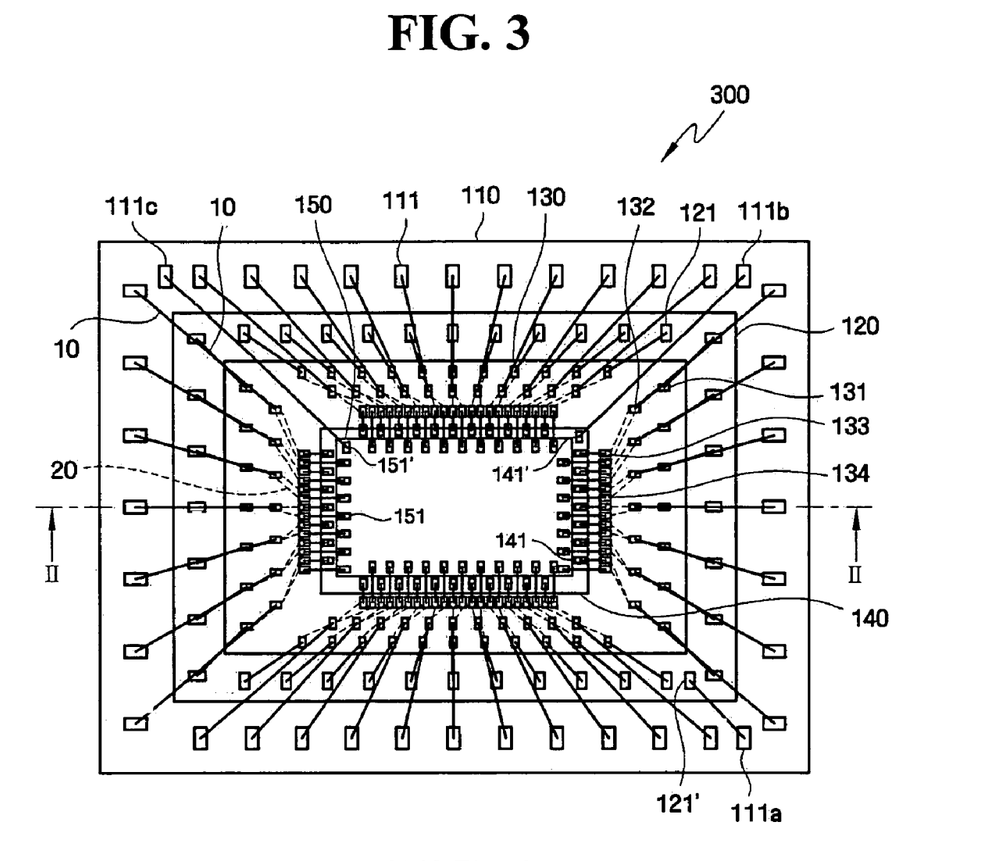
FIG. 3 is a plan view of a semiconductor device package according to another embodiment of the present invention.
Figure 4:
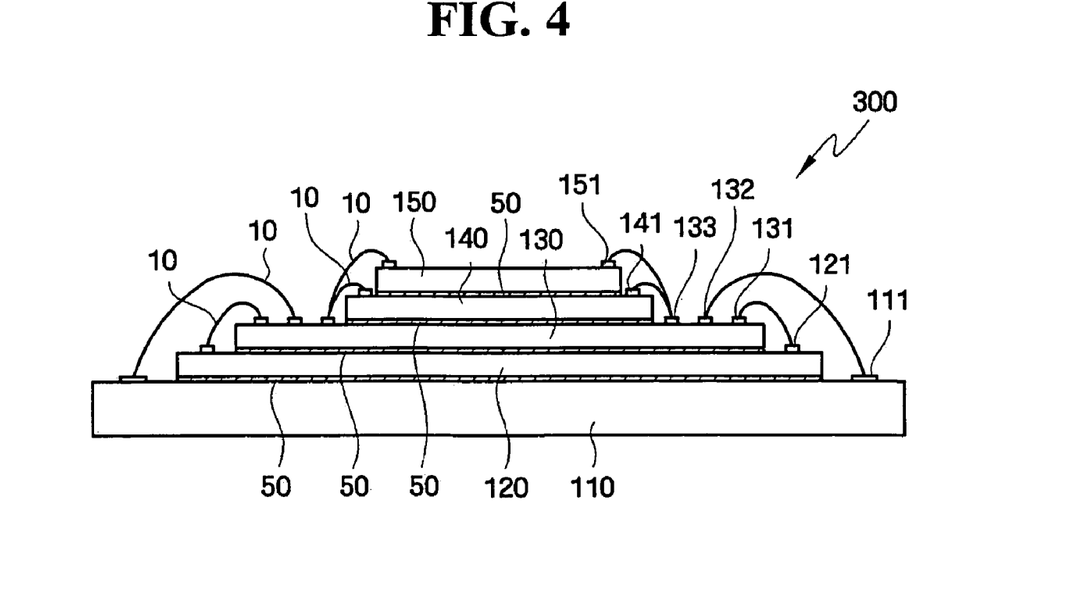
FIG. 4 is a cross-sectional view of the semiconductor device package illustrated in FIG. 3 as taken along line IV-IV' of FIG. 3.

Another embodiment of the present invention will now be described with reference to FIGS. 3 and 4 wherein FIG. 3 is a plan view and FIG. 4 is a cross-sectional view as taken along line IV-IV' of FIG. 3. For an explanatory convenience, like elements having like functions shown in FIGS. 1 and 2 denote like reference numerals and a description thereof will be omitted. A semiconductor device package 300 has a similar structure as that shown in FIGS. 3 and 4. The semiconductor device package 300, however, has an additional semiconductor chip 150 stacked on the semiconductor chip 140. An adhesive layer 50 is interposed between the semiconductor chip 140 and the semiconductor chip 150.

The semiconductor chip 150 includes wires (not shown) formed on a top surface of the semiconductor chip 150, common pins (not shown) connected to the wires, independent pins (not shown) connected to the wires, and chip pads 151 and 151' formed along an edge of the top surface of the semiconductor chip 120.

The wire of the semiconductor chip 150 may have functional devices, e.g. circuit devices such as transistors and the like, formed on a silicon substrate. The semiconductor chip 150 may be a memory chip or a logic/analog semiconductor chip. The common pins correspond to data pins and/or address pins operative relative to the functional devices of the chip 150, and the independent pins correspond to a power pin, a ground pin or a chip select pin operative relative to the functional devices of the chip 150.

The chip pads 151 and 151' may be used as electrode pads of an I/O electrode for externally connecting the semiconductor chip 150 and as a bonding pad for performing wire bonding. The chip pad 151 is electrically connected to the common pin of the semiconductor chip 150 and is electrically connected to a fourth bonding pad 134 of the interposer chip 130. In addition, the chip pad 151' is electrically connected to a chip select pin of the semiconductor chip 140 and is electrically connected to a substrate pad 111c of the substrate 110. In the embodiment shown in FIGS. 3 and 4, the chip pad 151' is electrically connected to the substrate pad 111b using a direct bonding wire 10. However, the present invention is not limited to this and the chip pad 151' may be electrically connected to the substrate pad 111c via a connecting wire of the interposer chip 130. Although the independent pin as a chip select pin has been illustrated, like the chip select pin, the independent pin as a power pin or as a ground pin may be electrically connected to the substrate pad 111c from the chip pad of the semiconductor chip 150 using the direct bonding wire 10 or may be electrically connected to the substrate pad 111c via the connecting wire of the interposer chip 130.

The wire layer of the semiconductor chip 150 may be protected by an insulating layer formed of SiN or polyimide and the like, but excluding the chip pads 151 and 151'.

As described above, the fourth bonding pad 134 electrically connects to the chip pad 151 of the semiconductor chip 150. Thus, the connecting wire of the interposer chip 130 includes the fourth bonding pad 134, a first bonding pad 131, a second bonding pad 132, a third bonding pad 133, and a wire 20. In this particular embodiment, the wire 20 is electrically connected to the first bonding pad 131, the second bonding pad 132, the third bonding pad 133, and the fourth bonding pad 134, e.g., to form a connecting or coupling region of interposer chip 130. As previously noted, however, other particular arrangements may include use of bonding wires as the wire 20 and may include use of pads as the wire 20 thereby allowing multiple bonding wire attachment thereto.

Since a test operation of the semiconductor device package 300 is substantially the same as described above, a description thereof will be omitted.

As described above, in the semiconductor device package according to the present invention, bonding wire instability, as found in prior arrangements where a plurality of semiconductor chips are stacked, can be prevented while still making the package light, thin and small. Furthermore, a separate direct access test may be performed on each semiconductor chip without additional equipment or integrated bypass circuitry.

While the present invention has been shown and described with reference to exemplary embodiments thereof, it will be understood by those skilled in the art that various changes in form and details may be made therein without departing from the spirit and scope of the invention as defined by the following claims and equivalents thereof.

What is claimed is:

1. A semiconductor device package comprising:
    a substrate having a plurality of substrate pads;
    a plurality of semiconductor chips, each of the semiconductor chips having at least one chip pad to which a common signal is applied and at least one chip pad to which respective independent signals are applied, wherein the at least one chip pad of each semiconductor chip to which respective independent signals are applied is directly connected with the substrate through bonding wires; and
    an interposer chip being bonded by wire to both the substrate and the at least one chip pad of each of the plurality of semiconductor chips to which the common signal is applied, the interposer chip having a plurality of bonding pads forming a connecting or coupling region, where corresponding ones of the bonding pads are electrically coupled to concentrate common signals.

2. The semiconductor device package of claim 1, wherein the at least one chip pad of each of the semiconductor chips to which the independent signals are applied further comprises a chip pad to which a high impedance is applied for a direct access test.

3. The semiconductor device package of claim 2, wherein each of the chip pads is respectively electrically connectable to the substrate.

4. The semiconductor device package of claim 1, wherein the interposer chip is formed using a wafer, a flexible printed circuit board, or a printed circuit board.

5. The semiconductor device package of claim 1, wherein the at least one connecting region includes a single layer or multiple layers formed upon the interposer chip.

6. The semiconductor device package of claim 1, wherein the connecting region comprises a plurality of electrically connected bonding pads, each corresponding to one of the plurality of semiconductor chip pads and electrically connected to the corresponding one of plurality of chip pads by way of a corresponding bonding wire.

7. The semiconductor device package of claim 1, wherein the plurality of semiconductor chips includes at least one memory chip and at least one logic/analog chip.

8. The semiconductor device package of claim 7, wherein the at least one logic/analog chip is disposed as one of a lowermost or an uppermost member of the semiconductor chips stacked upon the substrate.

9. A method of forming a semiconductor device package, the method comprising:
    placing an interposer element in a plurality of semiconductor chips stacked upon a substrate;
    concentrating signals common to at least two of the semiconductor chips at the interposer element;
    coupling the common signals from the interposer element to the substrate; and
    coupling independent signals from each of the semiconductor chips directly to the substrate.

10. The method of claim 9, wherein the interposer element resides between the at least two of the semiconductor chips.

11. The method of claim 9, wherein concentrating the common signals comprises electrically coupling pads of the at least two of the semiconductor chips to pads of the interposer chip.

12. The method of claim 9, wherein coupling the common signals comprises electrically coupling pads of the interposer element with pads of the substrate.

13. The semiconductor device package of claim 1, wherein the interposer chip is disposed on at least one of the plurality of semiconductor chips such that it does not directly contact the substrate.

14. The semiconductor device package of claim 13, wherein the interposer chip is a dummy semiconductor chip.

15. A semiconductor device package comprising:
    a substrate having a first substrate pad, a second substrate pad, and a third substrate pad;
    a first semiconductor chip disposed on the substrate, the first semiconductor chip having a first chip bonding pad and a second chip bonding pad;
    an interposer chip formed on the first semiconductor chip, the interposer chip having a first bonding pad, a second bonding pad, and a third bonding pad;
    a second semiconductor chip disposed on the interposer chip, the second semiconductor chip having a third chip bonding pad and a fourth chip bonding pad;
    a first bonding wire electrically connecting the first substrate pad of the substrate with the first chip bonding pad of the first semiconductor chip;
    a second bonding wire electrically connecting the second substrate pad of the substrate with the first bonding pad of the interposer chip;
    a third bonding wire electrically connecting the third substrate pad of the substrate with the third chip bonding pad of the second semiconductor chip;
    a fourth bonding wire electrically connecting the second chip bonding pad of the first semiconductor chip with the second bonding pad of the interposer chip; and
    a fifth bonding wire electrically connecting the fourth chip bonding pad of the second semiconductor chip with the third bonding pad of the interposer chip.

16. The package of claim 15, wherein the first, second, and third bonding pads of the interposer chip are electrically connected together with wire.

17. The package of claim 16, wherein the first, second, and third bonding pads of the interposer chip are configured to provide a common signal from the substrate to the first and second semiconductor chips.

18. The package of claim 15, wherein the interposer chip is formed using a wafer, a flexible printed circuit board, or a printed circuit board.

19. The package of claim 15, wherein the first and second semiconductor chips includes at least one memory chip and at least one logic/analog chip.

20. The package of claim 15, wherein the first chip bonding pad and the second chip bonding pad of the first semiconductor chip are formed in a peripheral region of the first semiconductor chip, and wherein the interposer chip is disposed on a central portion of the first semiconductor chip.

21. The package of claim 20, wherein the first, second, and third bonding pad of the interposer chip are formed in a peripheral region of the interposer chip, and wherein the second semiconductor chip is disposed on a central portion of the interposer chip.

22. The package of claim 20, further comprising adhesive layers interposed between the substrate and the first semiconductor chip, interposed between the first semiconductor chip and the interposer chip, and interposed between the interposer chip and the second semiconductor chip.

23. The package of claim 15, wherein the substrate further comprises a fourth substrate bonding pad, wherein the interposer further comprises a fourth bonding pad, and wherein the package further comprises:

a third semiconductor chip disposed on the second semiconductor chip, the third semiconductor chip having a fifth chip bonding pad and a sixth chip bonding pad;

a sixth bonding wire electrically connecting the fifth chip bonding pad of the third semiconductor chip with the fourth substrate bonding pad of the substrate; and a seventh bonding wire electrically connecting the sixth chip bonding pad of the third semiconductor chip with the fourth bonding pad of the interposer chip.

24. The package of claim 23, wherein the fourth bonding pad of the interposer chip is configured to provide a common signal from the substrate to the third semiconductor chip.

* * * * *

UNITED STATES PATENT AND TRADEMARK OFFICE
CERTIFICATE OF CORRECTION

PATENT NO. : 7,327,038 B2 Page 1 of 1
APPLICATION NO. : 11/322886
DATED : February 5, 2008
INVENTOR(S) : Heung-Kyu Kwon et al.

It is certified that error appears in the above-identified patent and that said Letters Patent is hereby corrected as shown below:

Column 4, line 39, the word "l4O" should read -- 140 --.

Signed and Sealed this

Thirtieth Day of September, 2008

JON W. DUDAS
*Director of the United States Patent and Trademark Office*